US008134853B2

United States Patent
Fastow et al.

(10) Patent No.: US 8,134,853 B2
(45) Date of Patent: Mar. 13, 2012

(54) HIGH READ SPEED ELECTRONIC MEMORY WITH SERIAL ARRAY TRANSISTORS

(75) Inventors: Richard Fastow, Cupertino, CA (US); Hagop Nazarian, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 46 days.

(21) Appl. No.: 12/642,162

(22) Filed: Dec. 18, 2009

(65) Prior Publication Data

US 2011/0149630 A1 Jun. 23, 2011

(51) Int. Cl.
G11C 5/06 (2006.01)
G11C 7/06 (2006.01)
H01L 21/336 (2006.01)

(52) U.S. Cl. .... 365/72; 365/207; 438/294; 257/E21.409

(58) Field of Classification Search ................ 365/0.72, 365/185.17, 185.22, 207
See application file for complete search history.

(56) References Cited

U.S. PATENT DOCUMENTS

| 6,853,029 | B2 | 2/2005 | Ichige et al. |
| 7,122,432 | B2 | 10/2006 | Shimizu et al. |
| 7,142,455 | B1 | 11/2006 | Lee et al. |
| 7,217,964 | B1 | 5/2007 | Fastow et al. |
| 7,288,809 | B1 | 10/2007 | Fastow et al. |
| 7,388,783 | B2 * | 6/2008 | Sakui ........................ 365/185.11 |
| 7,397,696 | B1 | 7/2008 | Wadhwa et al. |
| 7,535,767 | B2 | 5/2009 | Nazarian et al. |
| 7,567,457 | B2 | 7/2009 | Nazarian et al. |
| 7,633,786 | B2 * | 12/2009 | Goda et al. ........................ 365/63 |
| 7,652,947 | B2 | 1/2010 | Bernstein et al. |
| 2003/0141538 | A1 | 7/2003 | Hayashi |

OTHER PUBLICATIONS

Gunther Lehmann, Memory Circuit with Multi-Bit-Line Direct Sensing, Feb. 25, 2004, Siemens AG / IP.com, IPCOM000021650D, pp. 1-5.*

* cited by examiner

*Primary Examiner* — Hoai V Ho
*Assistant Examiner* — Tri Hoang
(74) *Attorney, Agent, or Firm* — Turocy & Watson, LLP

(57) ABSTRACT

Providing a serial array semiconductor architecture achieving fast program, erase and read times is disclosed herein. By way of example, a memory architecture can comprise a serial array of semiconductors coupled to a metal bitline of an electronic memory device at one end of the array, and a gate of a pass transistor at an opposite end of the array. Furthermore, a second metal bitline is coupled to a drain of the pass transistor. A sensing circuit that measures current or voltage at the second metal bitline, which is modulated by a gate potential of the pass transistor, can determine a state of transistors of the serial array. Because of low capacitance of the pass transistor, the serial array can charge or discharge the gate of the pass transistor quickly, resulting in read times that are significantly reduced as compared with conventional serial semiconductor array devices.

20 Claims, 13 Drawing Sheets

CONVENTIONAL NAND SENSING

HIGH SPEED SENSING

HIGH READ SPEED ELECTRONIC MEMORY WITH SERIAL ARRAY TRANSISTORS

BACKGROUND

Memory devices have a wide range of uses in modern electronics and electronic devices. In general, various types of electronic memory exist, including hard disc memory, floppy disc memory, magnetic tape memory, optical disk memory, and so on. One of the more innovative and diversified types of memory is semiconductor memory.

One type of semiconductor memory commonly used for modern electronics is nonvolatile Flash memory. Flash memory comprises arrays of semiconductor devices that can be utilized to store, erase and re-store digital information. Compared to other types of electronic memory, Flash memory is fast both in terms of programming and erasing, as well as reading data, has good data retention characteristics, and is highly cost effective. Accordingly, Flash memory is utilized for data storage in an ever-increasing number of electronic devices and applications, including computers, cell phones, smart-phones, digital cameras and camcorders, game stations, and so forth.

One great advantage of Flash memory is that stored data can be retained without continuous electrical power applied to a Flash memory module. In addition, Flash memory is a solid-state technology that can be very dense—in terms of memory cells per unit volume—typically requiring no moving parts for basic operation. Accordingly, Flash memory is ideal as removable and portable data storage for consumer electronics, and is utilized with universal interface technologies for a wide array of electronic devices, such as universal serial bus (USB) technology.

Like most consumer electronic technologies, advancements in nonvolatile memory are driven by a desire for faster, more dense (in terms of data storage per volume) and more cost-effective electronic devices. One major limiting factor for speed and sophistication of electronic devices and complexity of device software is the physical capabilities of digital memory employed by those devices. Invariably, smaller, faster computers require faster and denser memory. Research and development in nonvolatile memory is therefore generally focused on achieving these goals. In recent years, this research and development has achieved many advancements in nonvolatile solid-state memory, providing faster program, erase or read times, reduced power consumption, greater memory density, increased storage reliability, reduced error rate, and the like. However, these advancements are not all achieved in unison, and can be particular to different types of solid-state memory. For instance, in regard to Flash memory, NAND-type semiconductor memory has among the best program and erase speeds, has long-term storage reliability, and is highly scalable with higher cell densities, but has relatively slow read times as compared with other types of semiconductor memory (e.g., NOR-type memory). Ongoing research in non-volatile memory is directed at improving these or other deficiencies of semiconductor memory technologies, in general.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The subject disclosure provides a serial semiconductor memory architecture achieving fast program, erase and read times as compared with conventional serial semiconductor memory architectures. The architecture comprises a serial array of memory transistors coupled to a metal bitline of an electronic memory device at one end of the array, and a gate of a pass transistor at an opposite end of the array. In some aspects of the subject disclosure, the pass transistor has low capacitance relative to the metal bitline or relative to the serial array of memory transistors.

A second metal bitline is then coupled to the drain of this pass transistor, while ground is coupled to the source of this pass transistor. Current flow through the second bitline is modulated by the potential on the gate of the pass transistor. Coupled to the second bitline is a sensing circuit which can be utilized to detect current flow, which is indicative of a state of a memory cell of the serial array. Accordingly, a serial array of memory transistors connected to a first metal bitline can be sensed from a second metal bitline of the memory device. Further, because the pass transistor has relatively small capacitance, a relatively small amount of current through the serial array is sufficient to charge or discharge a gate node of the pass transistor, enabling/disabling current flow at the second metal bitline. Accordingly, sensing a program or erase state of a memory cell of the serial array can be accomplished much faster than with a conventional serial semiconductor memory architecture.

In other aspects of the subject disclosure, provided is a method of fabricating a serial semiconductor memory array having a fast read speed. The method can comprise forming trench isolation lines into a substrate of the semiconductor device in one layer of the substrate, and forming multiple arrays of memory transistors, each array comprising multiple memory transistors electrically coupled in serial, between the trench isolation lines. Respective ends of each serial array are coupled with different respective metal bitlines of the serial semiconductor memory. Opposite ends of each serial array are coupled to respective gates of pass transistors, which also couple adjacent bitlines to ground. Furthermore, sensing circuits are formed at respective bitlines to measure electrical characteristics thereof, as modulated by pass transistors coupled to respective adjacent serial arrays. These electrical characteristics (e.g., current flowing through a bitline, voltage of the bitline, etc.) are indicative of a memory cell state of at least one adjacent serial array. Sensing states of respective memory cells can be accomplished quickly relative to conventional serial semiconductor memory architectures, due to a low capacitance of the pass transistors relative to the capacitance of the respective metal bitlines.

The following description and the annexed drawings set forth in detail certain illustrative aspects of the disclosed subject matter. These aspects are indicative, however, of but a few of the various ways in which the principles of the innovation can be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
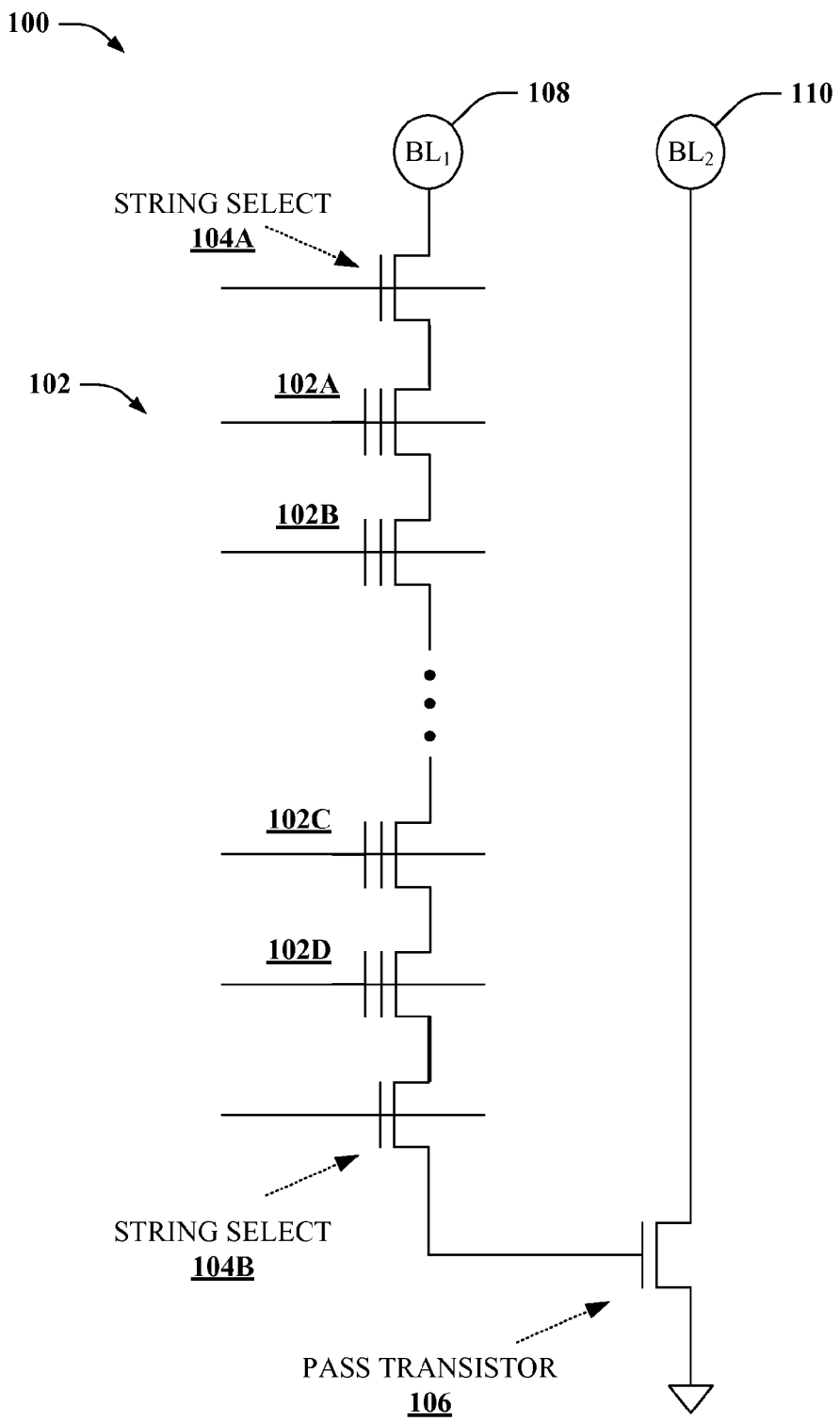
FIG. 1 illustrates a diagram of an example semiconductor memory architecture according to aspects of the subject disclosure.

The disclosed subject matter is described with reference to the drawings, wherein like reference numerals are used to refer to like elements throughout the description. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram or schematic form in order to facilitate describing the subject innovation.

As utilized herein, terms "component," "system," "architecture" and the like are intended to refer to a computer or electronic-related entity, either hardware, a combination of hardware and software, software (e.g., in execution), or firmware. For example, a component can be one or more semiconductor storage cells, a processor, a process running on the processor, an object, an executable, a program, or a computer. The component can include erasable programming (e.g., process instructions at least in part stored in erasable memory) or hard programming (e.g., process instructions burned into non-erasable memory at manufacture). By way of illustration, both a process executed from memory and the processor can be a component. One or more components can reside within a process or thread of execution and a component can be localized on one processing device (e.g., onboard processing) or distributed between two or more processing devices (e.g., involving onboard and host computer processing). As another example, an architecture can include an arrangement of electronic hardware (e.g., parallel or serial transistors), processing instructions and a processor, which implement the processing instructions in a manner suitable to the arrangement of electronic hardware.

Furthermore, the claimed subject matter can be implemented as a method, apparatus, or article of manufacture using typical manufacturing, programming or engineering techniques to produce hardware, firmware, software, or any combination thereof to control an electronic device to implement the disclosed subject matter. The term "article of manufacture" as used herein is intended to encompass an electronic device, a semiconductor device, a computer, or a computer program accessible from any computer-readable device, carrier, or media. Computer-readable media can include hardware media, or software media. In addition, the media can include storage media, or transport media. For example, computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, signal interface modules (e.g., a wireless communication interface), or the like. Of course, those skilled in the art will recognize many modifications can be made to this configuration without departing from the scope or spirit of the claimed subject matter.

The disclosed subject matter relates to improved non-volatile memory and performance thereof. More specifically, provided is a new non-volatile memory architecture that achieves significant benefits over conventional non-volatile memory architectures. Also disclosed are various operating processes for programming or reading the disclosed non-volatile memory. As an example, aspects of the subject disclosure provide memory that achieves optimal program/erase times, as well as optimal read times. Typically, optimizing program/erase times requires a memory architecture or processing technology with inherently slower read times, or vice versa. The subject disclosure provides a significant improvement to this problem. In addition, the provided memory exhibits optimal scalability, enabling improved memory cell density in conjunction with smaller transistor technology. In addition, the memory exhibits strong data retention and reliability, optimal power consumption, multi-level cell capability, among other improvements in non-volatile memory technology, discussed herein.

FIG. 1 illustrates a diagram of an example serial semiconductor memory architecture 100 suitable for high speed reading. The semiconductor memory architecture 100 comprises a plurality of memory transistors (102A, 102B, 102C, 102D, referred collectively as 102A-102D) electrically coupled in a serial array 102. Moreover, the semiconductor memory architecture 100 achieves fast program and erase times, and furthermore achieves very fast read times compared with conventional serial semiconductor memory architectures (e.g., NAND memory). Accordingly, the architecture of FIG. 1 provides a substantial improvement over such conventional memory.

A serial array of memory transistors (102) comprises a plurality of memory transistors 102A-102D directly coupled from source to drain. A convention utilized for the subject disclosure is that the top lead of each semiconductor (102A-102D) refers to a source lead, and a bottom lead for each transistor is a drain lead (a lead coming off of the side of each transistor is a gate lead). Thus, as depicted for FIG. 1 a drain lead of the first transistor 102A of the array (closest to the bitline contact B1 108) is coupled to a source lead of the second transistor 102B; a drain lead of the second transistor 102B is coupled to a source lead of a subsequent transistor in array 102, and so on, until a drain lead of an N−1$^{th}$ transistor 102C is coupled with a source lead of an Nth transistor 102D to complete array 102. It should be appreciated that the convention of source to drain coupling is utilized here for illustrative purposes only. In some cases, an array of serially coupled memory transistors could be coupled from drain to source instead (where the drain lead of respective transistors is closer to the bitline junction than source leads). In other cases, denomination of drain and source can depend on relative voltages at those respective leads. These various conventions can depend on a type of transistor employed for array 102 (e.g., metal-oxide semiconductor field-effect transistor [MOSFET], junction FET [JFET], and so on), for instance.

In addition to the foregoing, array 102 can be coupled to a set of string select transistors 104A, 104B. String select transistor 104A couples array 102 to a contact off of a first metal bitline 108 (bitline one), and can activate or deactivate array 102 with respect to bitline one 108. In addition, a second string select transistor 104B couples array 102 to the gate of a pass transistor 106. The gate node of the pass transistor can be charged or discharged as a result of a voltage applied to array 102 from bitline one 108. Furthermore, pass transistor 106 can connect or isolate a second metal bitline 110 (bitline two) with ground, allowing current to flow through the second bitline.

An amount of current flowing through bitline two 110 can be utilized to determine a potential of the gate node of pass transistor 106. In particular aspects of the subject disclosure, the gate node of pass transistor 106 and array 102 can have a low capacitance relative to bitline one 108 and bitline two 110. Accordingly, charging and discharging of the gate node of pass transistor 106 can occur much more quickly as compared with charging/discharging the relatively large capacitance bitlines (108, 110) of conventional serial semiconductor memory architecture. To illustrate the foregoing, memory transistor array 102 can be pre-charged by activating string select transistors 104A, 104B, applying a voltage on bitline one 108, and applying a pass voltage(s) to each wordline of array 102. Such a sequence will then result in a potential being applied to the gate of pass transistor 106. Next, a read voltage(s) is applied to a wordline of a selected memory transistor (e.g., 102A-102D) of array 102, and the voltage applied at bitline one 108 is reduced. This sequence then causes the gate node of pass transistor 106 to discharge through array 102 if the selected memory transistor is in a state that conducts current (e.g., an erase state). However, if the selected memory transistor (102A-102D) is in a non-conducting state (e.g., a program state), then the gate node of the pass transistor 106 will not discharge through array 102. Accordingly, charging or discharging of the gate node of the pass transistor 106 can be determinative of a state of a selected memory transistor (102A-102D) of array 102, which can be sensed from the sensing circuit coupled to bitline two 110. Thus, semiconductor architecture 100 enables sensing of a transistor on one bitline (e.g., bitline one 108) from another bitline (e.g., bitline two 110) of a semiconductor memory device. Furthermore, because the gate node of the pass transistor 106 has relatively low capacitance, charging or discharging through array 102 can occur much more quickly than with conventional serial semiconductor memory architectures. Accordingly, architecture 102 provides a significant enhancement of prior memory architectures (e.g., NAND memory).

Although a single array (100) is depicted at FIG. 1, it is to be appreciated that additional arrays can be provided for a semiconductor memory architecture (100), such as a two-dimensional plane of arrays (100) adjacent to or consecutive to array 102. As another example, a three-dimensional array comprising stacks of array 102 or stacks of two-dimensional planes of arrays 102 can be provided, or groups of such three-dimensional arrays, and so forth. The semiconductor transistors (102A-102D) can be formed utilizing various suitable semiconductor processing techniques. It is to be appreciated, however, that the subject disclosure should not be limited to one or another processing technique; rather, any suitable semiconductor processing technique (e.g., photolithography) can be employed for forming the semiconductor transistors (102).

Further to the above, it should be appreciated that cell architecture 100 can be constructed from a variety of semiconductor transistor technologies. For instance, the semiconductor transistors (102A-102D) could include non-volatile memory, such as flash memory, read only memory (ROM), programmable ROM (PROM), erasable programmable read only memory (EPROM), electronically erasable programmable read only memory (EEPROM), and the like. As an example, cell architecture 100 can comprise single-bit flash memory (e.g., having a single program state and a single erase state), multi-bit flash memory (e.g., a two-bit cell having three distinct program voltage thresholds and an erase voltage threshold), multi-cell flash memory (e.g., a dual-cell technology comprising a pair of distinct and adjacent transistors), or the like, or a combination thereof. Furthermore, it should be appreciated that cell architecture 100 can utilize various memory transistor technologies. For example, cell architecture 100 can comprise charge-trap (CT)-NAND-type semiconductor transistors (102A-102D) or floating gate (FG)-NAND-type semiconductor transistors (102A-102D).

As utilized herein, the term "memory device" or "memory storage device" refers to a non-volatile digital data storage entity that comprises at least one memory cell architecture 100, and preferably many instances of memory cell architecture 100 arranged in suitable stacked or adjacent layers. In addition, the term "memory cell" refers to one or a small group of transistors (102A-102D) of one or more memory cell architectures 100. For instance, a cell could comprise a single transistor (102A-102D), two sides of a transistor (e.g., as utilized in MirrorBit® memory), or groups of transistors (e.g., four-transistor array). In addition, the term "bit level" refers to one or more discreet values, or value ranges, of electric charge stored in a memory cell that correspond to a discreet information character. The term "bit" refers to two discreet information characters, each defined as a different "state" of the cell or transistor(s). As an illustrative example, a single transistor cell having one bit, can be programmed to one of two states. The states correspond to different values (or value ranges) of charge stored in a cell, generating a measurable threshold voltage of the cell. For this example, assume that the states are defined as 0 volts to 1.5 volts=a state of "1", or an un-programmed state, and 3.5 volts to 5.0 volts=a state of "0", or a programmed state. A wordline read voltage ($V_{WL}$) between the value ranges (or values) can be utilized to distinguish the states of this example cell. For instance, if $V_{WL}$ is selected to be 2.0 volts, a cell threshold voltage above 2.0 volts is assumed to be a programmed bit state, and a cell threshold voltage below 2.0 volts is assumed to be an un-programmed bit state. It is to be appreciated that this is only one example of permitted voltage ranges for bit states. Also, a cell can have more than a single bit. For instance, a two-bit cell can comprise four distinct charge levels, defined as four discreet information characters (e.g., 0, 1, 2 and 3, for instance). Other examples known to one of skill in the art, or made known to one of skill in the art by way of the context provided by the subject disclosure, are considered within the scope of the description and appended claims.

Figure 2:
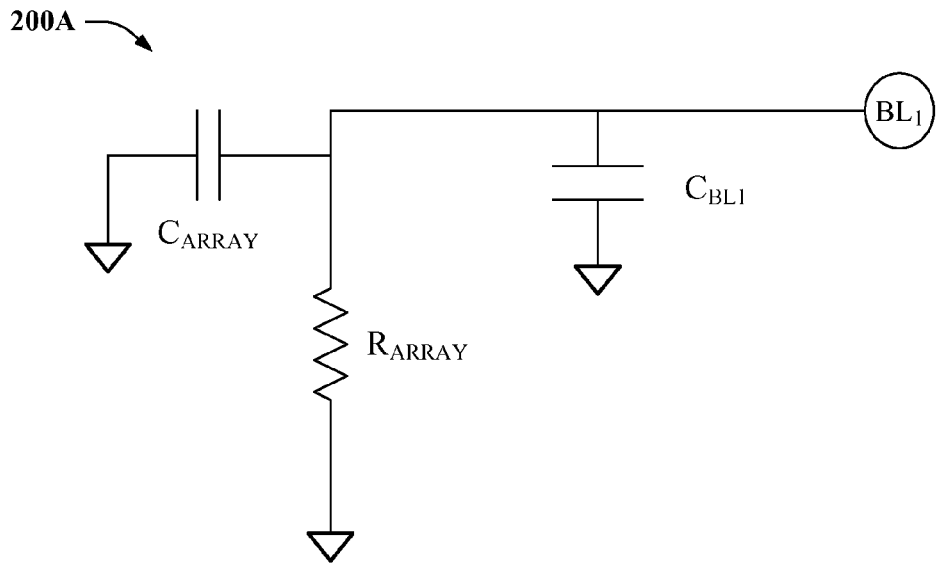
FIG. 2 depicts a schematic diagram of an example high read speed serial semiconductor memory architecture relative to a conventional serial semiconductor memory architecture.
Figure 2:
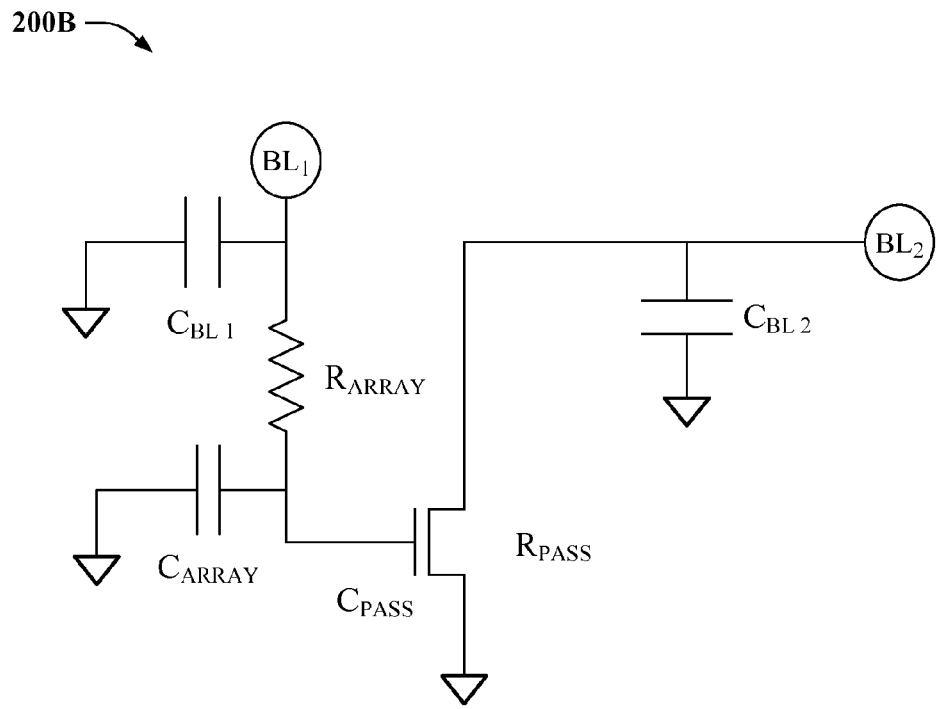

FIG. 2 illustrates schematic diagrams of a conventional serial semiconductor memory architecture 200A and a high read speed serial semiconductor memory architecture 200B according to particular aspects of the subject disclosure. Conventional serial memory architecture 200A can comprise a NAND-type semiconductor array, for instance. In conventional NAND architecture, an array of memory transistors is coupled to a bitline and to ground. Determining a program state of a particular memory transistor of the array is accomplished by selecting that transistor (e.g., applying a read voltage to a wordline of the particular memory transistor) while non-selected wordlines are kept in a conducting state (e.g., applying a high pass voltage to the non-selected wordlines of the array), and applying a read voltage to the bitline. If the particular memory transistor conducts current with the read voltage applied at its gate (e.g., erased state), current will flow from the bitline through the array to ground. Otherwise, current will not flow through the array. Based on whether current is flowing through the bitline or not, a state of the transistor is determined. However, because of the large capacitance of the bitline and the large resistance of the array (even in the erased state), discharging the bitline through the array can take a substantial amount of time resulting in long read times (e.g., tens of microseconds) as compared with other transistor technologies (e.g., AND or NOR technologies). Specifically, a discharge time for a bitline through a typical NAND transistor array is approximated by the following equation:

$$\tau = R\_string \times C\_BL$$

Thus, for large bitline capacitance C_BL and large array resistance R_string (which is typical of NAND architecture), the discharge time is significant. This traditional drawback of serial array semiconductor technologies has existed for some time.

High read speed serial memory schematic 200B provides a substantial reduction in read times over traditional serial memory schematic (200A). For this schematic 200B, a memory transistor array is coupled to a first bitline and to the gate of a pass transistor. The drain of the pass transistor couples to a second bitline, and the source of the pass transistor couples to ground. Although the bitlines have large capacitance, the pass transistor can be designed so as to have a small capacitance as well as a small resistance. In this case, discharge time through the memory transistor array is approximated by the following equation:

$$\tau = R\_string \times (C\_transistor + C\_array) + R\_transistor \times C\_BL$$

Because the pass transistor capacitance and resistance can be small, and the capacitance of the array can be small compared to the bitline capacitance, the discharge time is also small compared with conventional serial array architectures. In effect, the pass transistor with a small capacitance can be charged or discharged with a very small current, and therefore relatively quickly. As a result, read times for the high read speed architecture can be one or more orders of magnitude faster than the conventional architecture, alleviating the primary drawback for serial memory array architectures. Accordingly, the high read speed serial memory architecture can have fast read times, as well as fast program and erase times, significantly improving solid state memory.

Figure 3:
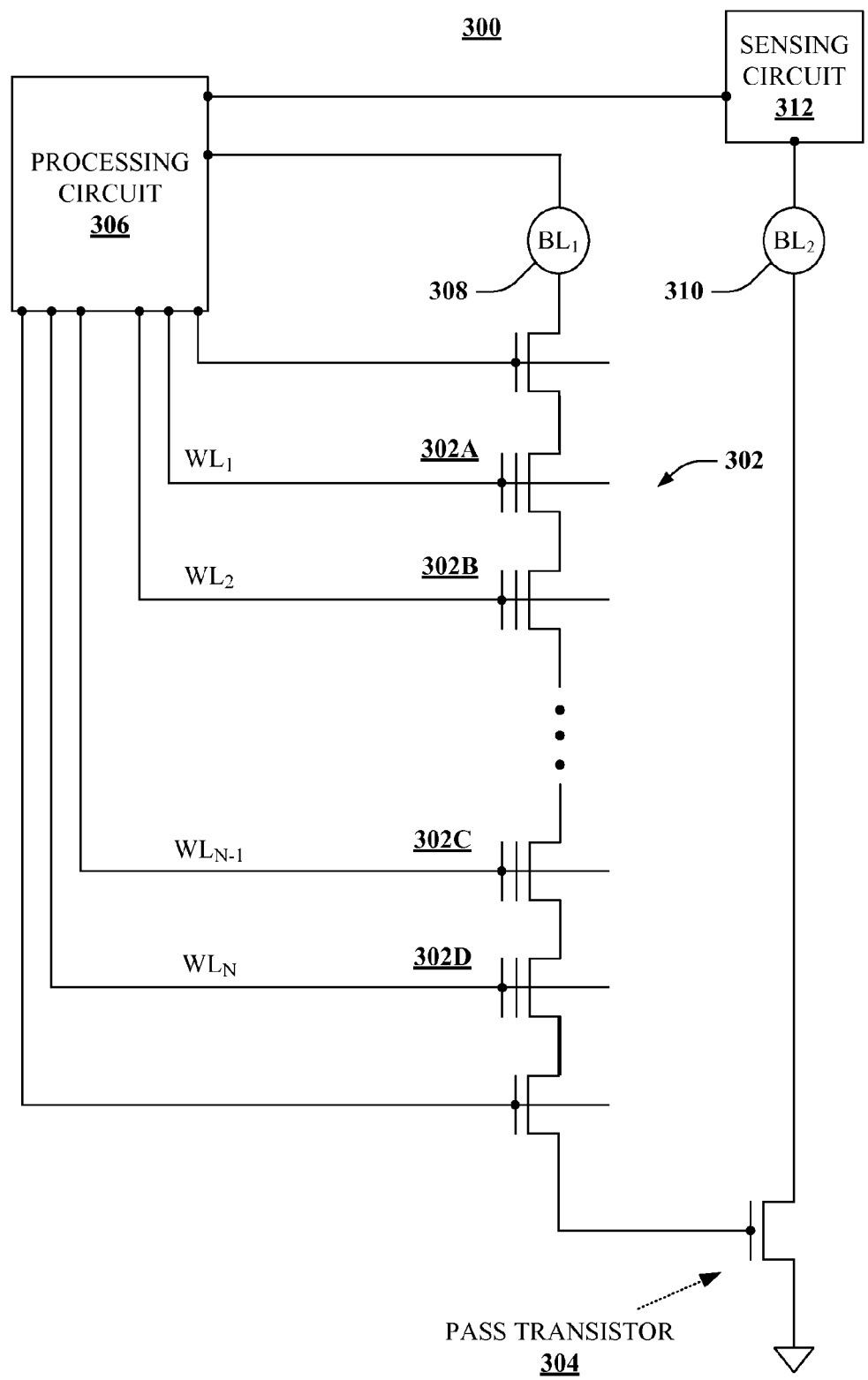
FIG. 3 illustrates a diagram of an example semiconductor memory processing system according to further aspects of the subject disclosure.

FIG. 3 illustrates a block diagram of an example memory processing system 300 according to aspects of the subject disclosure. Processing system 300 comprises a plurality of memory transistors 302A-302D electrically coupled in a serial array 302. One end of array 302 is coupled with a contact off of a first metal bitline 308 of processing system 300, and an opposite end of array 302 is coupled to a gate of a pass transistor 304 (optionally with a select transistor in between the opposite end of array 302 and pass transistor 304). Each transistor 302A-302D of array 302 comprises a gate defined by the respective wordlines of processing system 300. Specifically, transistor 302A is defined by wordline 1 ($WL_1$), transistor 302B is defined by $WL_2$, and so on, up through an Nth transistor 302D defined by $WL_N$. The respective wordlines connect to a processing circuit 306, which can apply and regulate a voltage for the respective wordlines.

Pass transistor 304 can be designed to have small gate capacitance relative to first bitline 308 (and second bitline 310), and small resistance relative to array 302. Accordingly, the gate node of the pass transistor 304 can be charged and discharged relatively quickly. In addition to the foregoing, a contact off of a second bitline 310 of processing system 300 is coupled to a drain of pass transistor 304, whose source is coupled to ground. Coupled to the second bitline 310 is a sensing circuit 312, which can be utilized to detect current flow through second bitline 310, which is modulated by the charging or discharging of the gate node of pass transistor 304.

In addition to the foregoing, processing circuit 306 can apply and regulate a voltage to bitline one 308 and bitline two 310, respectively. To read, or determine a program state of, a memory transistor of array 302 (e.g., transistor 302A), processing circuit 306 can select array 302 (e.g., by applying a suitable voltage to select transistors coupled to the array), apply a read voltage to the wordline associated with such memory transistor (e.g., $WL_1$) and a pass voltage to unselected wordlines (e.g., $WL_2$-$WL_N$) of array 302 to enable current flow through transistors 302B-302D. In one example, a pre-charge voltage can be applied on bitline one 308 or induced on the serial array (e.g., by employing a high pass voltage for the unselected wordlines—sufficient to induce capacitive coupling on the serial array) to charge the gate node of pass transistor 304. Voltage potential at the gate node (or gate potential) of pass transistor 304 then modulates current flowing through bitline two 310, which can be sensed using sensing circuit 312. Optionally, an isolation voltage can be applied to a select transistor located between array 302 and pass transistor 304, to maintain the gate potential of pass transistor 304. Processing circuit 306 applies a read voltage to $WL_1$ to select transistor 302A. Bitline one 308 is then reduced in voltage (e.g., by grounding bitline one 308). If memory transistor 302A is in an erase state (e.g., below 1.5 volts), current flows through array 302 and bitline one 308, discharging the gate node of pass transistor 304. This discharging modulates current flow through bitline two 310 which is measured by sensing circuit 312. Accordingly, current flow on bitline two 310 is a result of charging/discharging the gate node of pass transistor 304, which in turn is indicative of a state of memory transistor 302A. This state can be recorded by processing circuit 306.

As an alternate example to the foregoing, processing circuit 306 can select memory transistor 302A with a read voltage applied to $WL_1$, while applying a pass voltage to unselected wordlines to enable current flow through memory transistors 302B-302D. A select voltage (e.g., 2.5 volts) can be applied to array 302. If memory transistor 302A is erased, the select voltage can cause a current to flow in array 302, charging the gate node of the pass transistor 304 (which is determined at sensing circuit 312). Otherwise, no charge accumulates at the gate node of the pass transistor 304 (which is also determined at sensing circuit 312). Accordingly, charging or not charging the gate node of the pass transistor can be determinative of a state of memory transistor 302A in this alternate example. It should be appreciated that other examples of charging/discharging the gate node of the pass transistor 304, thereby modulating current flow at bitline two 310 can be employed to determine a state of a memory transistor coupled to bitline one 308. Such other examples known to one of skill in the art, or made known to one of skill in the art by way of the context provided herein are incorporated as part of the subject disclosure.

Figure 4:
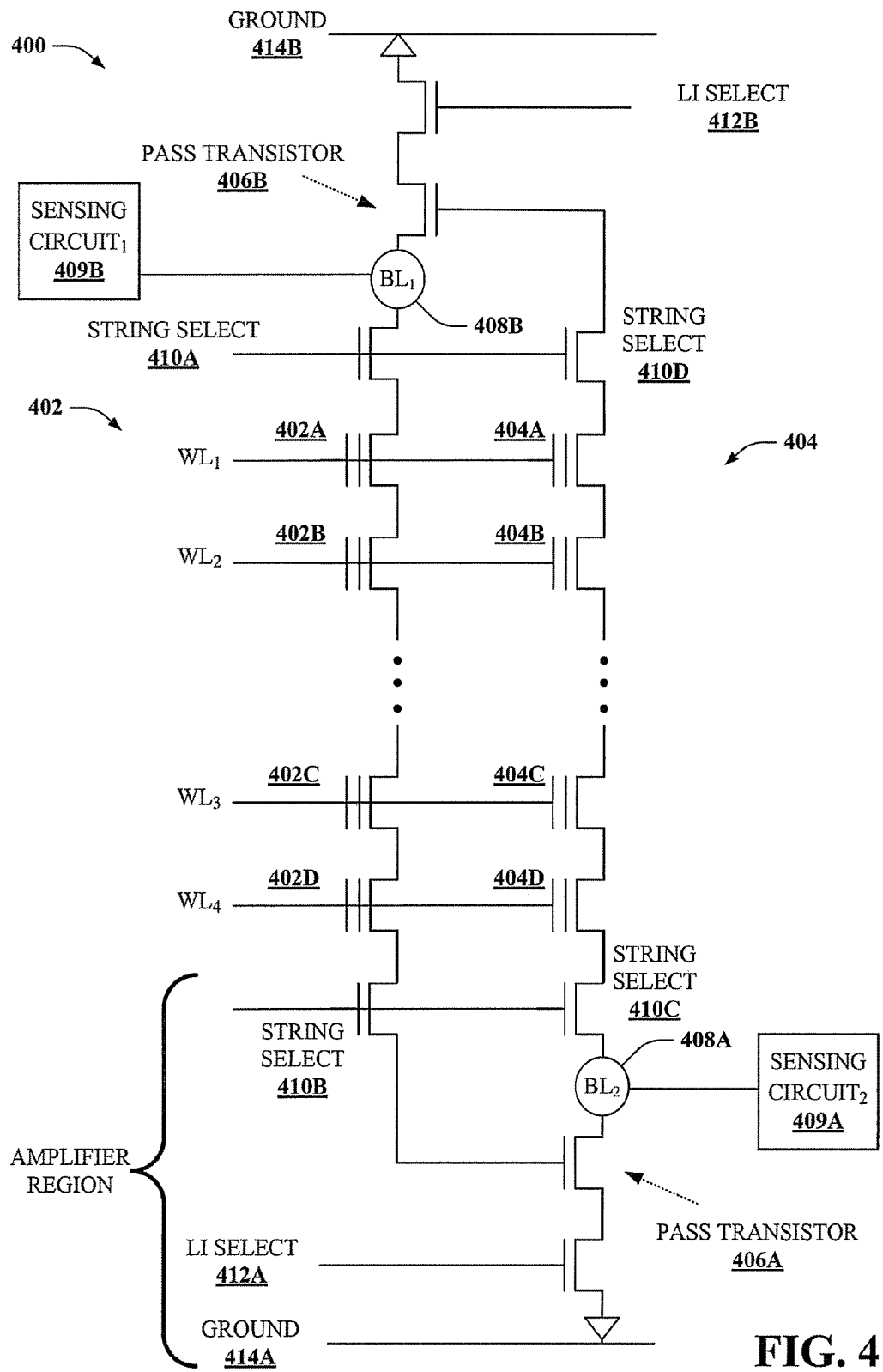
FIG. 4 depicts a diagram of a sample high read speed serial semiconductor memory architecture according to particular aspects disclosed herein.

FIG. 4 illustrates a block diagram of a serial semiconductor memory architecture 400 according to particular aspects of the subject disclosure. Architecture 400 provides increased memory density as well as improved read times for a serial array of memory transistors. Specifically, architecture 400 employs at least two memory transistor arrays (402, 404) for each pair of metal bitlines (408B, 408A) within a region of a semiconductor substrate. In addition, architecture 400 provides for sensing a state of one array of memory transistors from an adjacent bitline, as described herein (e.g., see FIG. 3, supra).

Architecture 400 comprises a first serial array of memory transistors 402, comprising transistors 402A, 402B, 402C and 402D (referred collectively as 402A-402D). First array 402 is coupled at one end to a string select transistor 410A, which in turn is coupled to a contact with a first bitline 408B. In addition, at an opposite end array 402 is coupled to a string select transistor 410B, which in turn is coupled to a gate of a first pass transistor 406A. First pass transistor 406A couples a second bitline 408A to ground through a transistor (LI select) 412A. In addition to the foregoing, architecture 400 comprises a second serial array of memory transistors 404 comprising transistors 404A, 404B, 404C and 404D (referred collectively as 404A-404D). Second array 404 is coupled at one end to a string select transistor 410C, which in turn is coupled to a contact with second bitline 408A. At an opposite end array 404 is coupled to a string select transistor 410D, which in turn is coupled to a gate of a second pass transistor 406B. Second pass transistor 406B couples the first bitline 408B to ground through another transistor (LI select) 412B.

By suitably controlling the bitline and wordline voltages shown in 400, the program/erase state of a memory transistor in array 402 or array 404 can be ascertained. As described herein, charging or discharging of the gate node of the pass transistor 406A can be measured from second bitline 408A, by means of a second sensing circuit, sensing circuit$_2$ 409A electrically connected thereto (e.g., in a similar manner as shown in FIG. 3 at sensing circuit 312). This charging/discharging is indicative of the program/erase state of selected memory transistors of array 402, and thus the sensing circuit coupled to second bitline 408A can sense the program/erase state of these selected transistors as well. Furthermore, by designing a pass transistor (406A) with sufficiently low capacitance and resistance, the charging/discharging of both the gate node of the pass transistor and the second bitline 408A can be accomplished much more quickly than conventional serial array transistor technology, resulting in improved read performance, without significantly impacting program or erase performance.

Likewise, by suitably controlling the bitline and wordline voltages shown in 400, the program/erase state of a memory transistor in array 404 can be ascertained. For instance, a first sensing circuit, sensing circuit$_1$ 409B electrically connected with first bitline 408B (e.g., in a similar manner as shown in FIG. 3 at sensing circuit 312) can be utilized to measure an electrical response at first bitline 408B from a memory transistor in array 404. As with first pass transistor 406A, designing a second pass transistor (406B) with sufficiently low capacitance and resistance enables charging/discharging of both the gate node of second pass transistor 406B and first bitline 408B much more quickly than in conventional serial array architectures. Furthermore, array 404 can be sensed from the first bitline 408B via a sensing circuit (not depicted).

Array 402 and array 404 are formed in a semiconductor substrate on different, isolated layers from bitlines 408B and 408A. As such, cascading pairs of arrays (402, 404) for each pair of bitlines (408B, 408A) of the semiconductor substrate can lead to a high transistor density, improving overall memory density, reducing size of a semiconductor substrate for a given number of transistors, or other potential benefits. An amplifier region of architecture 400 comprising string select transistors (410B, 410C), bitline contacts (408A), pass transistor (406A), LI select transistor (412A) and ground 414A is displayed at a lower region of architecture 400. It should be appreciated that an upper region (410A, 410D, 408B, 406B, 412B, and 414B) can comprise a corresponding amplifier region at an upper region of architecture 400, although such region is not specifically called out in FIG. 4. An example top-down view (similar to architecture 400) of an amplifier region of a semiconductor substrate is provided at FIG. 5, infra.

Figure 5:
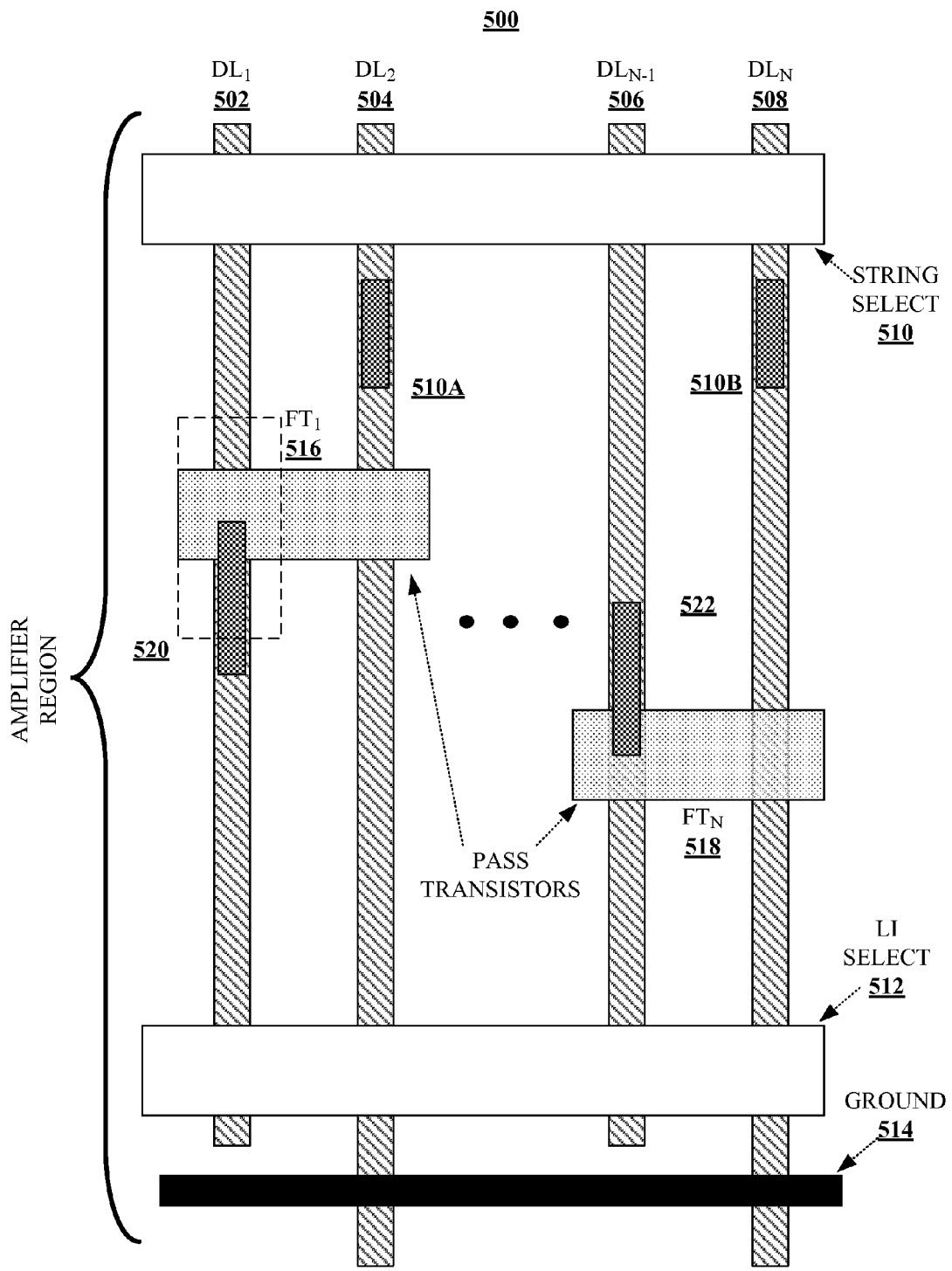
FIG. 5 depicts a layout of an example semiconductor memory architecture that achieves fast program, erase and read speeds according to particular aspects.

FIG. 5 illustrates a diagram of an example layout 500 to provide a serial semiconductor memory architecture as described herein. Particularly, layout 500 depicts an amplifier region comprising one or more pass transistors (518, 520) and interconnections with other parts of the amplifier region. It should be appreciated that layout 500 is just one example of a layout suitable to provide a serial memory transistor architecture according to aspects of the subject disclosure, and is not to be construed as limiting the subject disclosure to the particular depicted example.

Layout 500 comprises a set of diffusion lines formed in a substrate layer of a multi-layer structure. Particularly, layout 500 comprises a first diffusion line $DL_1$ 502, a second diffusion line $DL_2$ 504, and so on, up to an N-1$^{th}$ diffusion line $DL_{N-1}$ 506 and N$^{th}$ diffusion line $DL_N$ 508, where N is an integer larger than two. Diffusion lines 502-508 can be formed in the semiconductor substrate through ion implantation and isolated from each other using a suitable isolation material such as $SiO_2$, for instance.

In addition, layout 500 comprises a string select gate 510 that, in conjunction with the respective diffusion lines $DL_1$-$DL_N$ 502-508, define string select transistors (e.g., see FIG. 4 at 410A, 410D, or at 410B, 410C, supra). Specifically, at each respective intersection of string select gate 510 and a diffusion line (502-508) is defined one string select transistor. The string select gate 510 is formed into a second layer of the multi-layer structure, distinct from the substrate layer. For instance, the second layer can be above or below the substrate layer utilized for diffusion lines 502-508 (e.g., see FIG. 6, infra). Accordingly, the string select gate 510 is electrically isolated from diffusion lines 502-508, in general.

Electrical contacts 510A, 510B can be formed between diffusion lines (502-508) and metal bitlines of the serial semiconductor memory architecture (not shown). Specifically, contacts 510A, 510B electrically couple respective bitlines to $DL_2$ 504 and $DL_N$ 508, respectively. Accordingly, contacts 510A, 510B electrically couple these respective bitlines to a particular array of memory transistors formed on diffusion lines $DL_2$ 504 and $DL_N$ 508, respectively (via the string select transistors), or to ground 514 through the pass transistors 516, 518 and the LI select transistors 512. Thus, the particular array can be selected among other such arrays by controlling voltage at both a particular bitline and a particular string select gate 510.

Further to the above, a local interconnect (LI) select gate 512 defines the LI select transistors at the intersection of the LI select gate 512 and diffusion lines $DL_1$-$DL_N$ 502-508. The LI select gate 512 is formed into a layer of the multi-layer structure that is distinct from the substrate layer (e.g., above or below the substrate layer) utilized for diffusion lines 502-508. In one aspect of the subject disclosure, the layer of the multi-layer structure used to form LI select gate 512 can be the second layer (employed for string select gate 510). In other aspects, LI select gate 512 is formed into a third layer of the multi-layer structure. In either case, LI select gate 512 is electrically isolated from diffusion lines 502-508, in general. A ground 514 can further be formed, either as a separate conducting layer of the substrate, or as an external conducting layer, or the like.

Layout 500 also comprises a series of pass transistors 516, 518 formed in the multi-layer structure. Respective gates of the pass transistors 516, 518 can be formed into the second layer with string select region 510, or a third layer (e.g., with the LI select region 512), or even a separate layer altogether (e.g., a fourth layer). In either case, a set of local interconnects 520, 522 is employed to electrically couple the gates of respective pass transistors 516, 518 to respective diffusion lines (502, 506) of layout 500. According to one particular aspect of the subject disclosure, local interconnects 520, 522 can be formed of tungsten, a tungsten alloy, or a suitable tungsten derivative. Other electrical conductors can be employed for local interconnects 520, 522 as well.

According to one or more aspects of the subject disclosure, an amplifier region layout 500 comprises pairs of diffusion lines (502-508) each coupled to one bitline contact (510A, 510B) and one local interconnect (520, 522), respectively. For instance, as depicted, $DL_1$ 502 is coupled to local interconnect 520, whereas $DL_2$ 504 is coupled to contact 510. Furthermore, amplifier region layout 500 can correspond with another amplifier region (not depicted) at an opposite end of diffusion lines 502-508 (e.g., above the depicted region, as shown, see also FIG. 4, supra, comprising a lower amplifier region—which corresponds with layout 500, and an upper amplifier region). In this additional amplifier region, an opposite end of each pair of diffusion lines (502-508) are coupled to one local interconnect (520, 522) and one bitline contact (510A, 510B), respectively. Thus, for the additional amplifier region, $DL_1$ 502 is coupled to another bitline contact (coupled with a metal bitline on another layer of the multi-layer structure of layout 500 above or below $DL_1$ 502, for instance) and $DL_2$ 504 is coupled to another local interconnect (not depicted) and a gate of another pass transistor (not depicted). According to this aspect(s), each diffusion line is coupled with a local interconnect and a gate of a pass transistor in one amplifier region (at a first end of the diffusion line) and coupled with a contact with a bitline in another amplifier region (at an opposite end of the diffusion line).

The pass transistors 516, 518 can be electrically coupled (e.g., at respective gate nodes) with string select region 510 and electrically coupled to LI select region 512 through the diffusion lines 504 and 508 (e.g., at respective source nodes). Through the connection with string select region 510, respective pass transistors 516, 518 can further be coupled with one or more serial memory transistor arrays (not depicted), whose gates are formed in the second layer of the semiconductor structure with the string select region 510 (above the top of the page as the arrangement 500 is depicted). Furthermore, LI select region 512 can be coupled with ground region 514, thereby providing a path to ground through pass transistors 516, 518. The pass transistors 516, 518 can also be coupled with the metal bitlines (not shown) through contacts 510A and 510B (e.g., at respective drain nodes).

Figure 6:
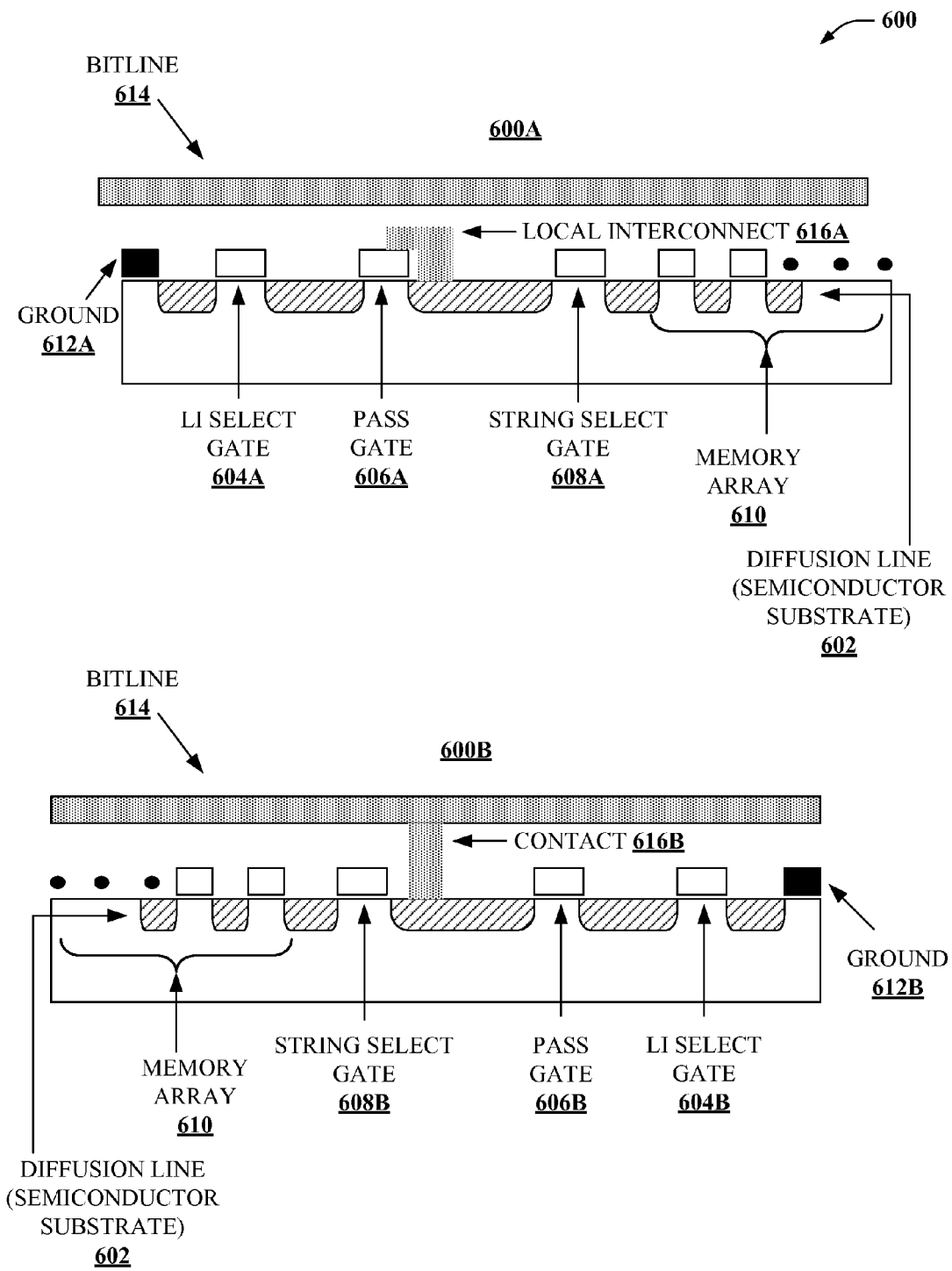
FIG. 6 illustrates a side-view layout of an example semiconductor memory architecture according to still other aspects of the subject disclosure.

FIG. 6 illustrates a block diagram of an example cross-sectional view 600 of a high read speed serial semiconductor memory device according to further aspects of the subject disclosure. Particularly, cross-sectional view 600 depicts a single diffusion line 602 of an array of adjacent diffusion lines (e.g., see FIG. 5, supra) of such memory device. Further, cross-sectional view comprises a first segment 600A of a lower amplifier region of the memory device and a second segment 600B of an upper amplifier region of the memory device. It is to be appreciated that the terms lower and upper do not refer to any particular height-based or implementation-based orientation of the respective segments. Rather, these terms are intended merely to distinguish one amplifier region from another region, in a similar manner as depicted by layout 500 of FIG. 5. In this context, therefore, lower amplifier region 600A refers to an amplifier region at the bottom of a drawing sheet (e.g., of FIG. 5), whereas upper amplifier region 600B refers to an amplifier region at the top of the drawing sheet. The terms lower and upper amplifier region are not to be construed as limiting application or operation of the high read speed serial semiconductor memory device depicted by cross-sectional view 600.

Lower amplifier region 600A comprises a semiconductor substrate into which diffusion line 602 is formed. Above diffusion line 602 are a series of transistor gates formed into a second layer of the semiconductor memory device. In one aspect of the subject disclosure, this second layer can be a layer suitable for forming gate regions of field effect transistors (FETs), metal-oxide field effect transistors (MOSFETs), or the like. In other aspects, however, the substrate layer and second layer can be suitable to form other types of transistors (e.g., bipolar junction transistors [BJTs], fusion transistor, multi-gate transistor, and so forth). It should also be appreciated that one or more insulating layers (not depicted) can exist between the substrate layer and the second layer of the semiconductor memory device.

At a far end of diffusion line 602 in lower amplifier region 600A is formed a lower LI select gate 604A. Lower LI select gate 604A is coupled at one end to electrical ground 612A and at an opposite end to a lower pass transistor formed by discrete lower pass gate 606A. It should be appreciated that discrete lower pass gate 606A extends in or out of the page of FIG. 6 over at least one other diffusion line (not depicted) of the semiconductor memory device, adjacent to diffusion line 602. In addition, discrete lower pass transistor gate is directly coupled to diffusion line 602 via a local interconnect 616. Local interconnect 616A couples a first end of an array of memory transistors (memory array 610) to discrete lower pass transistor gate 606A, via a string select transistor formed by string select gate 608A. Accordingly, electrical characteristics of memory array 610 can drive a gate voltage of the pass transistor, which can in turn modulate current or voltage at an adjacent diffusion line of the semiconductor memory device, as described herein.

Memory array 610 extends into an upper amplifier region of the semiconductor memory device depicted at 600B. Beyond memory transistors of memory array 610 is an upper string select gate 608B that is coupled to a bitline of the semiconductor memory device via a bitline contact 616B. In this manner, bitline 614 can provide electrical power for memory array 610 through a string select transistor formed by upper string select gate 608B and diffusion line 602. Also coupled to bitline contact 616B is a pass transistor formed by a discrete upper pass transistor gate 606B and diffusion line 602. This pass transistor serves to couple or isolate bitline 614 to electrical ground 612B (via an upper LI select transistor formed by an upper LI select gate 604B and diffusion line 602) depending on a gate voltage of the pass transistor. Moreover, this gate voltage is determined by an adjacent array of memory transistors (not depicted) formed along an adjacent bitline of the semiconductor memory device. Accordingly, electrical characteristics of the adjacent array of memory transistors can be measured at contact 616B or bitline 614.

According to particular aspects of the subject disclosure, local interconnect 616A and bitline contact 616B can be formed of different conductive materials. In alternative aspects of the subject disclosure, local interconnect 616A and bitline contact 616B can be formed of similar or substantially identical conductive materials. As a particular example, either or both of local interconnect 616A and bitline contact 616B can be formed from tungsten, a tungsten alloy, a tungsten derivative, or a suitable combination thereof.

The aforementioned diagrams have been described with respect to interaction between several components, or memory architectures. It should be appreciated that such diagrams and architectures can include those architectures specified therein, some of the specified architectures, and/or additional architectures. For example, a diagram could include processing circuit 306, and semiconductor architecture 400, or a different combination of these or other architectures. Sub-components could also be implemented as architectures electrically coupled to other sub-components rather than included within a parent architecture. Additionally, it should be noted that one or more disclosed processes could be combined into a single process providing aggregate functionality. For instance, a program process can comprise an erase process, or vice versa, to facilitate programming and erasing a semiconductor cell by way of a single process. Components of the disclosed architectures can also interact with one or more other components not specifically described herein but known by those of skill in the art.

In view of the exemplary diagrams described supra, process methodologies that may be implemented in accordance with the disclosed subject matter will be better appreciated with reference to the flow charts of FIGS. 7-10. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described hereinafter. Additionally, it should be further appreciated that the methodologies disclosed hereinafter and throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 7:
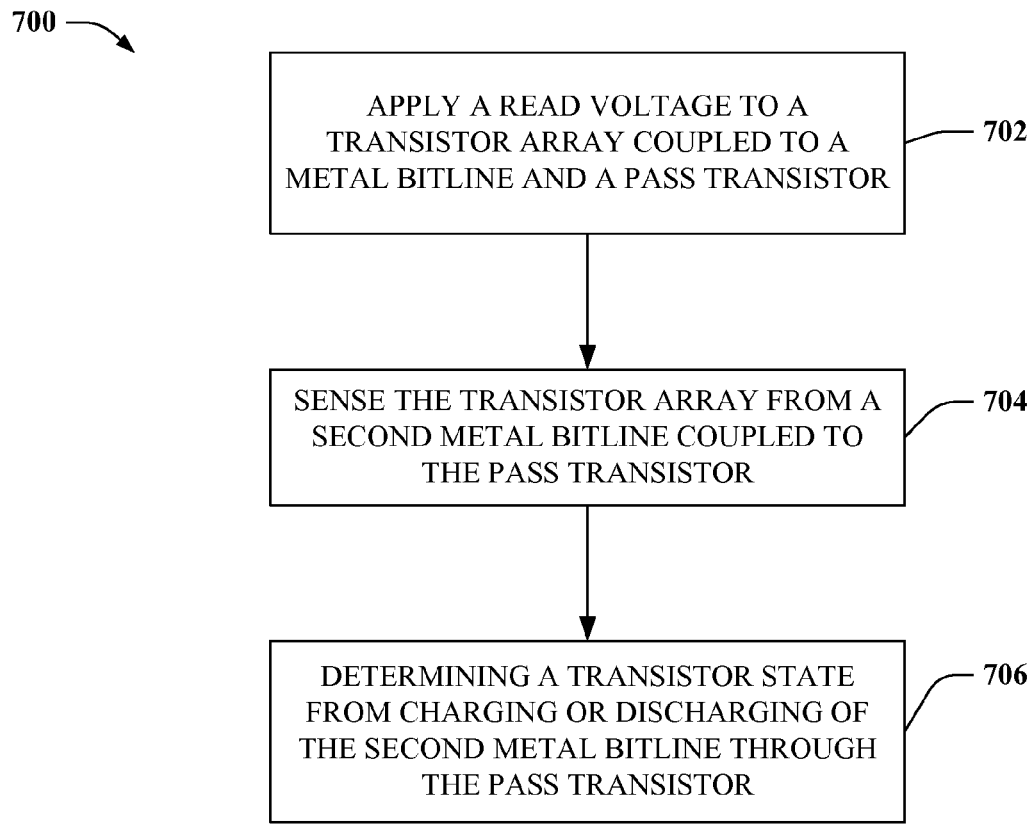
FIG. 7 depicts a flowchart of a sample methodology for sensing high read speed serial semiconductor memory according to one or more disclosed aspects.

FIG. 7 illustrates a block diagram of an example methodology 700 for providing improved read time for a serial array of memory transistors according to aspects of the subject disclosure. At 702, method 700 can comprise applying a read voltage to a serial memory transistor array coupled to a metal bitline of the serial array of memory transistors, and to a pass transistor. More particularly, the read voltage can be applied to a wordline of a selected transistor of the serial memory transistor array. Non-selected memory transistors are applied a pass voltage, enabling current to flow through such transistors. Accordingly, current flow through the array is determined according to a state of the selected memory transistor.

At 704, method 700 can comprise sensing the selected memory transistor array from a second bitline coupled to the pass transistor. Sensing can comprise employing a sensing circuit coupled with the second bitline, for instance. More particularly, the sensing circuit can be configured to identify current flow or lack thereof through the second bitline, as a result of conductivity of the pass transistor, which in turn is determined from a state of the selected memory transistor. As an example, for an n-channel selected memory transistor, the selected memory transistor will not conduct if in a program state. Accordingly, any charge on the gate node of the pass transistor remains (e.g., from a pre-charge operation), enabling current flow through the second bitline. The sensing circuit can measure this current flow which is determinative of a program state for the target transistor. On the other hand, the selected memory transistor will conduct if in an erase state, discharging the gate node of the pass transistor. The discharged pass transistor disables current flow on bitline two, which in turn is measured by the sensing circuit. Thus, the sensing circuit can logically associate current flow on bitline two with a program state of the selected transistor, and lack of current flow on bitline two with an erase state of the selected transistor. Accordingly, at 706, method 700 can determine a transistor state of the selected transistor from charging or discharging of the pass transistor. It should be appreciated that the subject disclosure is not limited to the foregoing example operation. For instance, p-channel transistors can be employed, resulting in different logical association between current flow on bitline two and program state of the selected transistor. Furthermore, different pre-charging sequences may result in a different logical association. The subject disclosure contemplates these and other suitable logical associations depending on transistor operation, as is known to one of skill in the art.

It should be appreciated that, if a suitable pass transistor is selected with low capacitance and resistance, charging/discharging of the pass transistor gate node can occur very rapidly, leading to very fast modulation of the current flowing through bitline two. This in turn leads to very fast sensing of the target transistor, and a high memory read speed. More specifically, method 700 can provide a significant improvement in read time over conventional serial memory array architectures.

Figure 8:
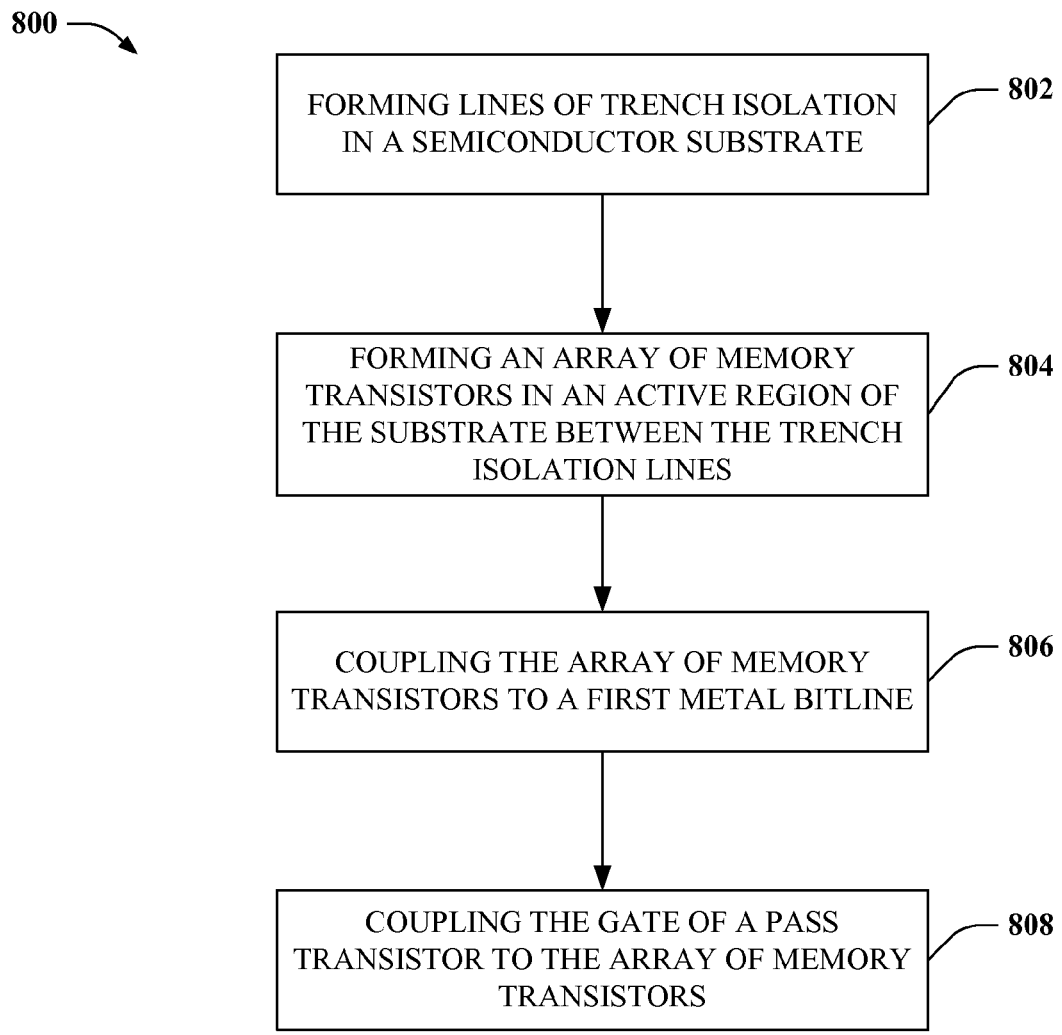
FIG. 8 depicts a flowchart of an example methodology for fabricating high read speed serial semiconductor memory according to particular aspects.

FIG. 8 illustrates a flowchart of a sample methodology 800 for fabricating a high read speed serial semiconductor memory device according to additional aspects of the subject disclosure. At 802, method 800 can comprise forming trench isolation lines into a first layer (e.g., a semiconductor substrate) of the semiconductor memory device. At 804, method 800 can comprise forming a serial array of memory transistors into an active region of the first layer (between the isolation lines) of the electronic memory device, wherein respective gate regions of the serial array of memory transistors are formed on a second layer of the semiconductor memory device. Particularly, the first and second layers can be chosen to be electrically insulated from each other. Furthermore, various mechanisms can be employed for forming diffusion lines and the serial array of memory transistors in the semiconductor memory device, such as photolithographic printing, etching, and so on.

At 806, method 800 can comprise coupling one end of the serial array of memory transistors to a contact off of a first metal bitline of the semiconductor memory device. The contact can be comprised of various suitable conductive materials (e.g., tungsten or a tungsten alloy or derivative). Furthermore, method 800 can comprise at 808 coupling an opposite end of the serial array to a gate of a pass transistor. A second metal bitline of the semiconductor memory device is then coupled to a drain node of this pass transistor, while ground is coupled to a source node of this pass transistor. In one aspect of the subject disclosure, the source node of the pass transistor can be coupled directly to electrical ground. In other aspects of the subject disclosure, one or more other semiconductor devices (e.g., a LI select transistor) can be positioned between the source node of the pass transistor and the electrical ground. Furthermore, it should be appreciated that one or more layers can be chosen to provide a low resistance path from the pass transistor to ground, relative to diffusion lines of the semiconductor memory device or the serial array of memory transistors. Such low resistance can yield significant improvements to read times of the serial array of transistors, as described herein.

Figure 9:
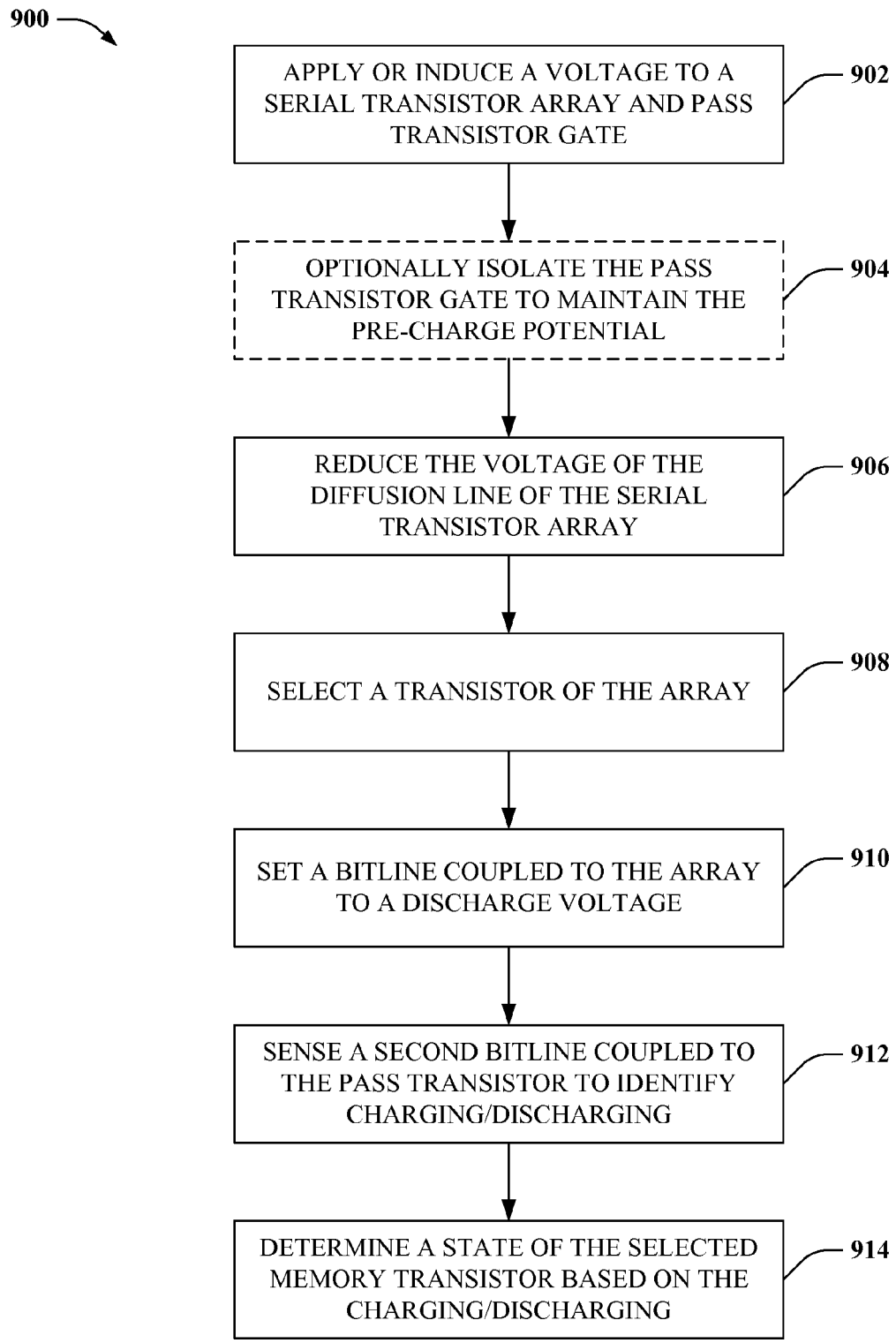
FIG. 9 illustrates a flowchart of an example methodology for determining a program state of a cell of high read speed serial semiconductor memory.

FIG. 9 illustrates a flowchart of a sample methodology 900 for sensing program state of a serial transistor array according to still other aspects of the subject disclosure. At 902, method 900 can comprise applying or inducing a pre-charge voltage to a serial memory transistor array thereby charging the gate node of a pass transistor coupled to the array. At 904, method 900 can optionally comprise isolating the gate node of the pass transistor from the serial array to maintain the pre-charge potential. According to at least one aspect of the subject disclosure, isolating the gate node of the pass transistor can comprise applying a suitable isolation voltage to a transistor positioned between the pass transistor and the serial transistor array.

At 906, method 900 can comprise reducing the voltage of the serial memory transistor array. At 908, method 900 can comprise selecting a memory transistor of the array. At 910, method 900 can optionally comprise setting a bitline coupled to the array to a suitable discharge voltage (e.g., 0 volts). At 912, method 900 can comprise sensing a second bitline coupled to the pass transistor to determine the potential on the gate node of the pass transistor. At 914, method 900 can comprise determining a state of the selected memory transistor based on the charging or discharging of the gate node of the pass transistor.

Figure 10:
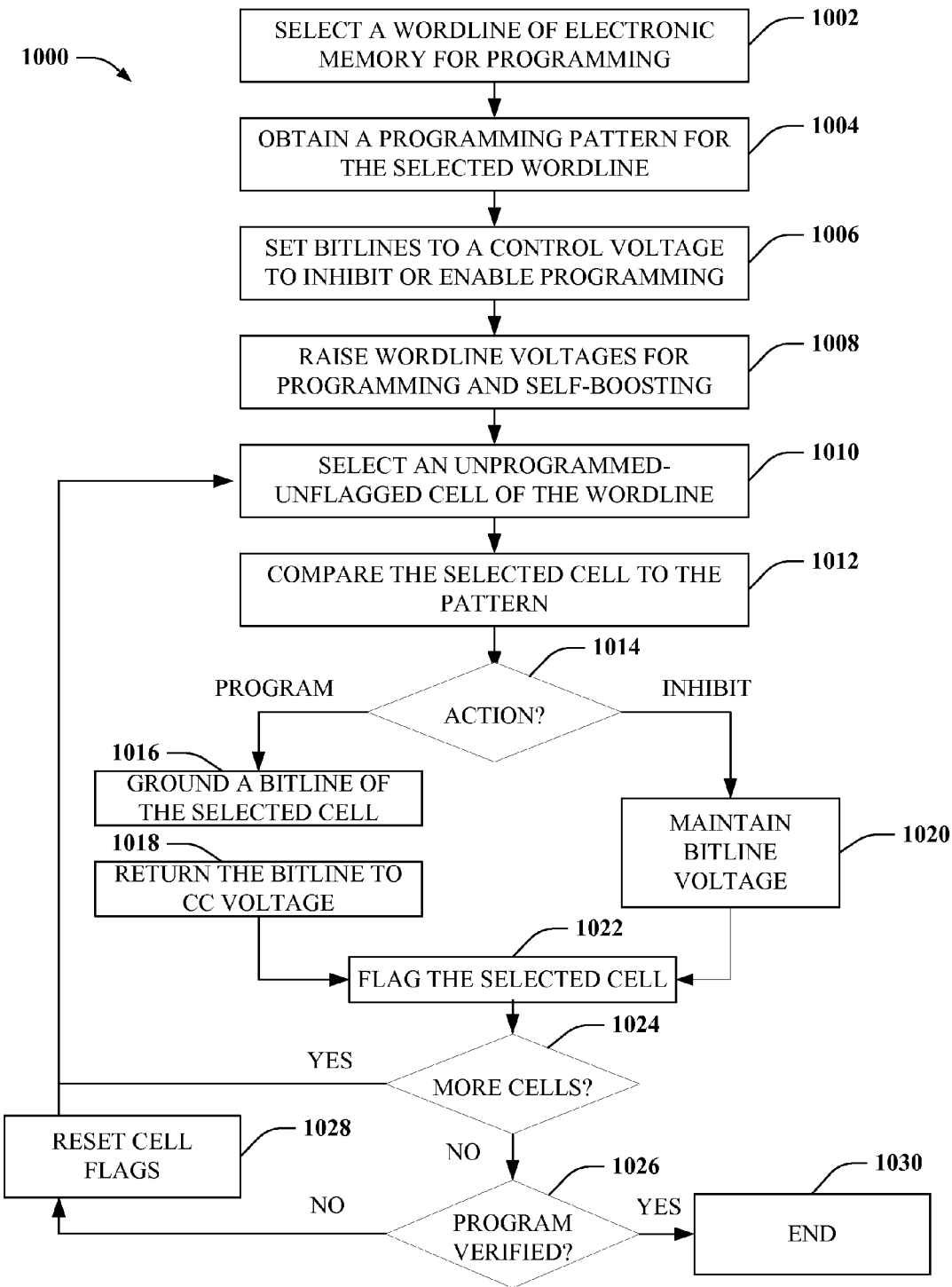
FIG. 10 depicts a flowchart of an example methodology for programming high read speed serial semiconductor memory according to particular aspects.

FIG. 10 illustrates a flowchart of a sample methodology 1000 according to still other aspects of the subject disclosure. More particularly, methodology 1000 provides a process for programming a serial array memory device as described in the subject disclosure. At 1002, method 1000 can comprise selecting a wordline of electronic memory for programming. At 1004, method 1000 can comprise obtaining a programming pattern for the selected wordline. At 1006, method 1000 can comprise setting bitlines of the memory device to a control voltage to either inhibit or enable programming. At 1008, method 1000 can comprise raising wordline voltages for programming and self-boosting. Raising a wordline voltage for programming can comprise, for instance, applying a high program voltage to the selected wordline (e.g., substantially 20 volts). Raising a wordline for self-boosting can comprise, for instance, raising unselected wordlines to a moderate voltage to inhibit programming of the unselected wordlines. In at least one aspect of the subject disclosure, the moderate voltage can comprise substantially 10 volts.

At 1010, method 1000 can comprise selecting an un-programmed and un-flagged cell of the wordline. At 1012, method 100 can comprise comparing the selected cell to the programming pattern. At 1014, a determination is made as to whether the selected cell matches a corresponding state of the programming pattern. If so, an action of 'inhibit' is output at 1014, and method 1000 can proceed to 1020. Otherwise, an action of 'program' is output at 1014, and method 1000 proceeds to 1016.

At 1016, method 1000 can comprise grounding a bitline of the selected cell. At 1018, method 1000 can comprise returning the bitline to the control voltage to halt programming. From 1018, method 1000 can proceed to 1022.

At 1020, method 1000 can maintain the bitline voltage of the selected cell at the control voltage to halt programming of the cell. At 1022, method 1000 can flag the selected cell as matching the programming pattern. At 1024, a determination is made as to whether remaining cells exist for programming on the selected wordline. If not, method 1000 can proceed to 1026, otherwise method 1000 returns to 1010 to select additional un-programmed, un-flagged cells for programming.

At 1026, method 1000 determines whether the programming is verified. If so, method 1000 proceeds to 1030 and terminates. Otherwise, method 1000 proceeds to 1028. At 1028, method 1000 resets programming flags of the cells coupled to the selected wordline. From 1028, method 1000 can proceed to 1010 to re-initiate programming of the selected wordline.

Figure 11:
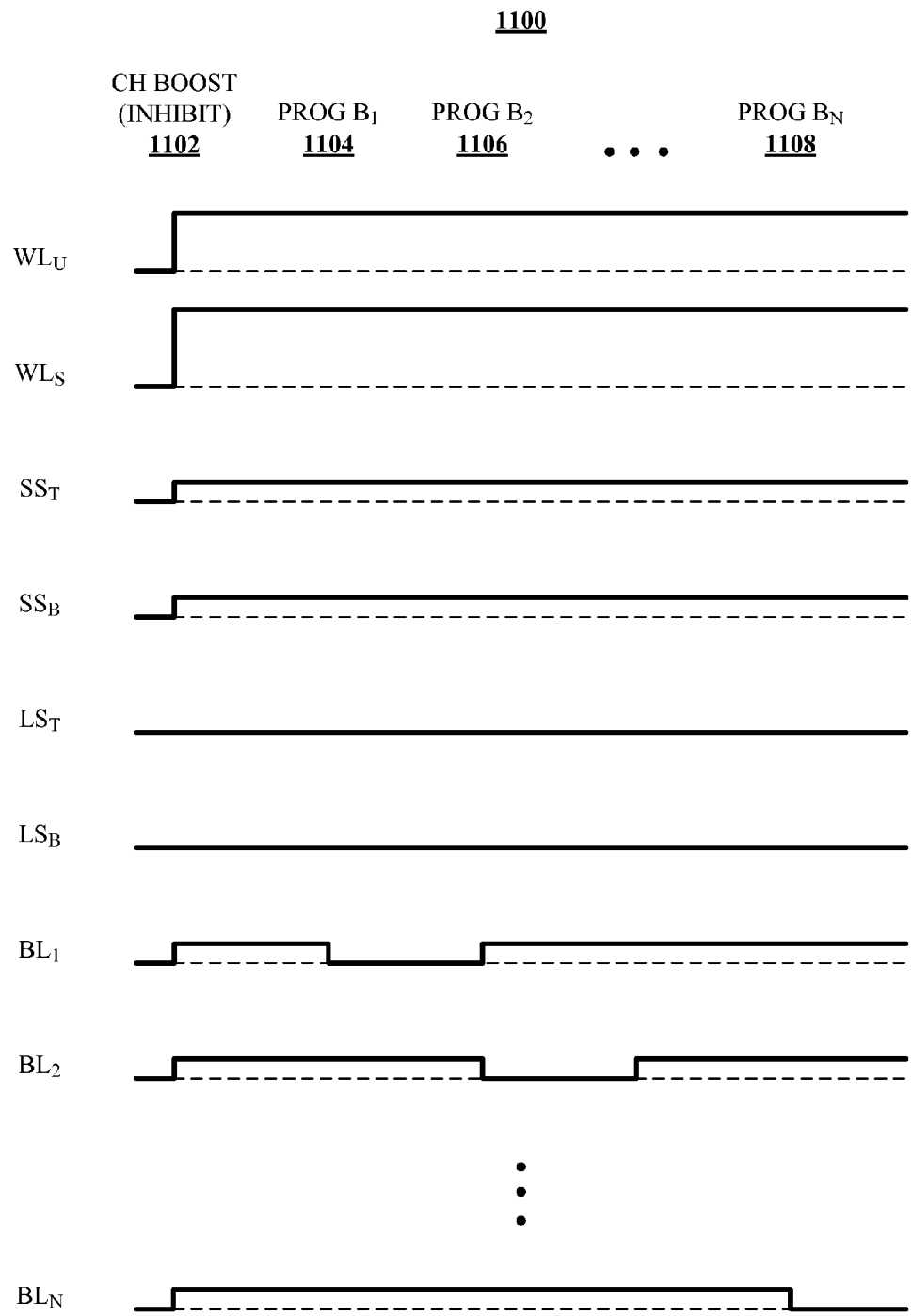
FIG. 11 illustrates a diagram of an example programming operation for high read speed serial semiconductor memory according to further aspects.

FIG. 11 illustrates an example electrical voltage diagram 1100 for a programming operation for a serial array transistor memory device according to aspects disclosed herein. The electrical voltage diagram comprises N+1 distinct timing points corresponding to distinct programming operations, where N is an integer greater than 1. The timing points comprise the following device operations: a channel boost (for inhibiting programming) 1102 at a first timing point, programming a first subset of memory device bitlines 1104 at a second timing point, programming a second subset of memory device bitlines 1106 at a third timing point, and so on, up to programming an $N^{th}$ subset of memory device bitlines 1108 at an $N+1^{th}$ timing point.

Channel boost 1102 is performed by raising each bitline as well as string select lines of a target group of serial array memory transistors to a control voltage (e.g., 2.5 volts) that inhibits programming. LI select transistors are maintained at zero volts. In contrast, wordlines of the memory device are raised to a high voltage. Specifically, a selected wordline $WL_S$ is raised to a high program voltage (e.g., 20 volts) while unselected wordlines $WL_U$ are raised to a moderate boost voltage (e.g., 10 volts).

Programming the first subset of bitlines 1104 is accomplished by lowering a voltage of such bitlines to a program voltage. In some aspects, the program voltage can comprise 0 volts (e.g., ground) or another suitably low voltage to induce programming of cells on the selected wordline $WL_S$ and subset of bitlines. Furthermore, additional subsets of bitlines can be programmed by raising a prior set of bitlines to the control voltage, and lowering the additional subset(s) of bitlines to the program voltage. Programming can be iteratively performed for respective subsets of bitlines at subsequent timing points (1104, 1106 . . . 1108, . . . ). To end programming, the string select lines can be lowered to 0 volts, along with the wordlines and bitlines.

Figure 12:
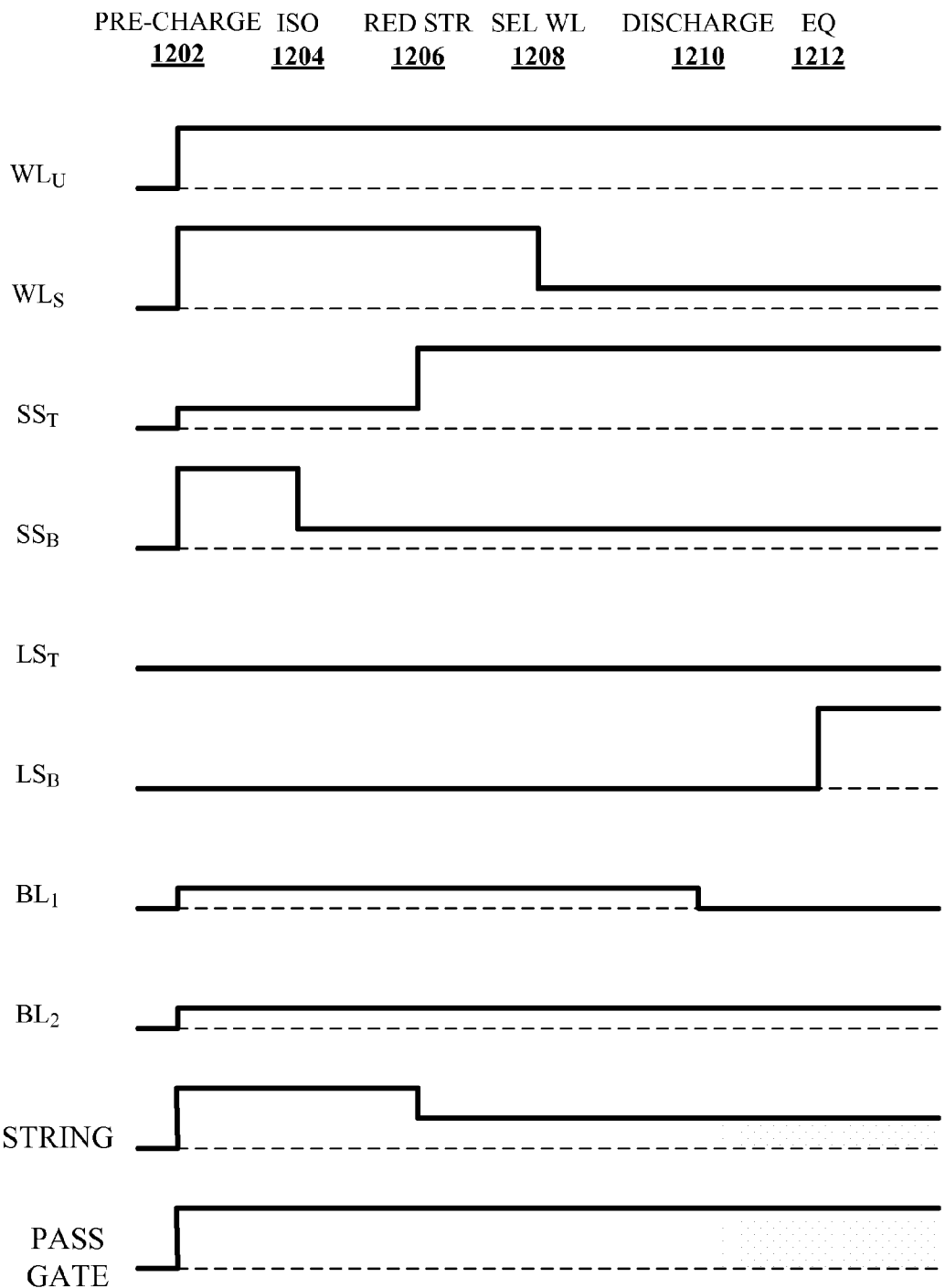
FIG. 12 depicts a diagram of one example sensing operation for high read speed serial semiconductor memory described herein.

FIG. 12 depicts a sample electrical voltage diagram 1200 for one example read operation according to aspects of the subject disclosure. The read operation comprises several read steps performed at subsequent timing points 1202-1212. Specifically, a pre-charge operation is performed at a first timing point 1202, a pass gate node isolation operation is performed at a second timing point 1204, a string voltage reduction is performed at a third timing point 1206, a wordline selection operation is performed at a fourth timing point 1208, a discharge operation is performed at a fifth timing point 1210, and an equalization operation is performed at a sixth timing point 1212, respectively.

The pre-charge operation 1202 comprises raising a selected read wordline $WL_S$ to a high voltage and unselected wordlines $WL_U$ to a moderate voltage. In addition, a first string select transistor $SS_T$ is raised to a low positive voltage (e.g., 1.2 volts) whereas a second string select transistor $SS_B$ is raised to the high voltage. Further to the above, bitlines $BL_1$ and $BL_2$ associated with a target memory transistor array are raised to the low positive voltage. These actions induce a moderate positive voltage (e.g., 2.5 volts) on the target memory transistor array and the gate node of the pass transistor.

The isolation operation 1204 is conducted by lowering a voltage of the second string select transistor $SS_B$ to the low positive voltage (e.g., 1.2 volts), in order to maintain the pre-charge potential. Optionally, the isolation operation 1204 can be skipped, so that the potential of the gate node of the pass transistor follows that of the target array.

The string reduction operation 1206 is performed by raising the first string select transistor $SS_T$ to a high pass voltage. This has the effect of reducing the potential of the target memory transistor array. The wordline selection operation 1208 is performed by decreasing the selected wordline $WL_S$ to the read voltage. Furthermore, the discharging operation 1210 is then performed by lowering the bitline associated with the target memory transistor array $BL_1$ to a read voltage (e.g., 0 volts). Finally, the equalization operation 1212 is performed by raising a LI select voltage $LS_B$ to a high positive voltage (e.g., 5.0 volts), which enables current to flow through $BL_2$.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" "has" or "having" are used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

Figure 13:
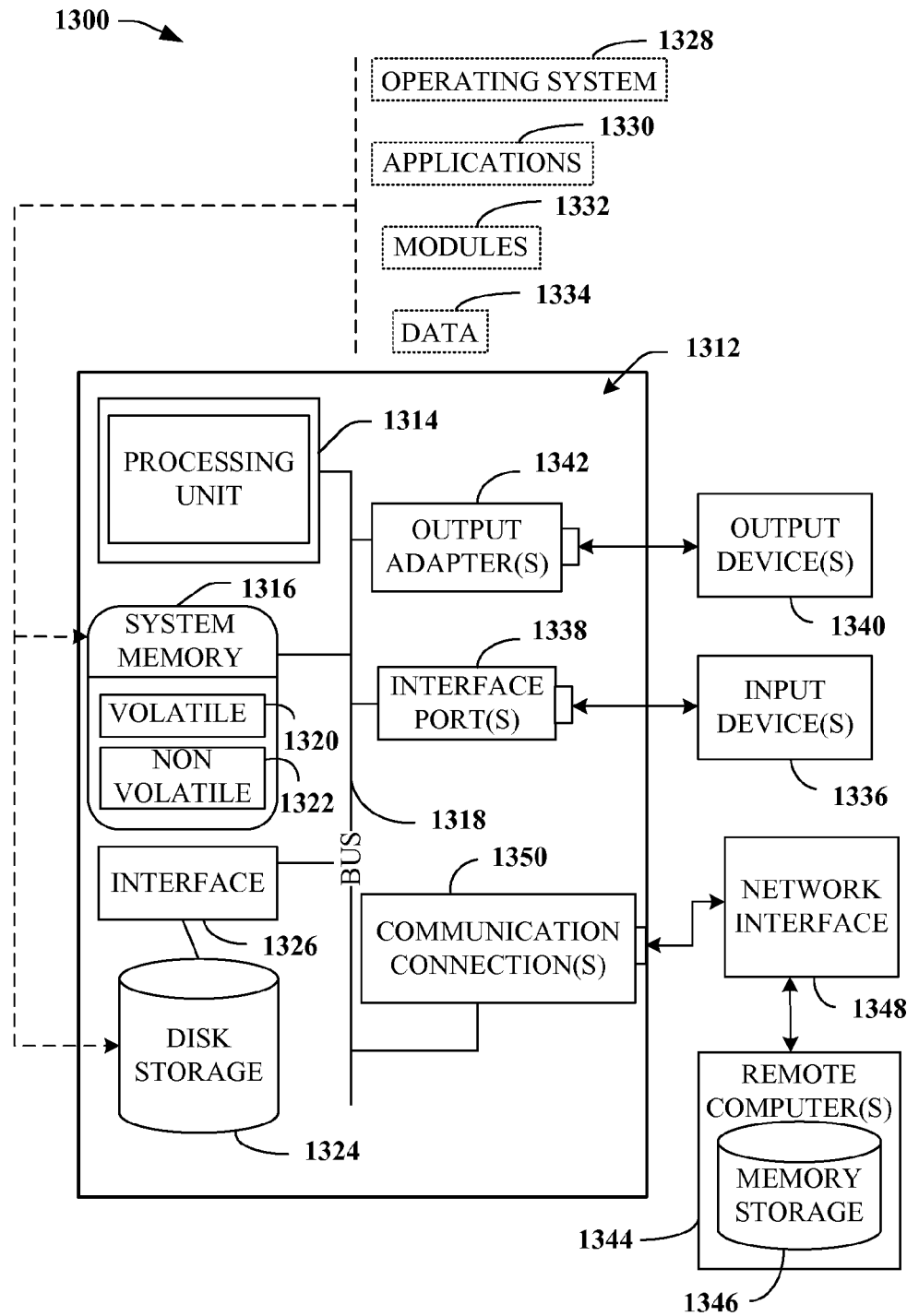
FIG. 13 depicts a block diagram of an example processing system for utilizing or accessing non-volatile memory according to general aspects disclosed herein.

In order to provide a context for the various aspects of the disclosed subject matter, FIG. 13, as well as the following discussion, is intended to provide a brief, general description of a suitable environment in which various aspects of the disclosed subject matter can be implemented or processed. While the subject matter has been described above in the general context of semiconductor architectures and process methodologies for manipulating semiconductor devices of such architectures, those skilled in the art will recognize that the subject innovation also may be implemented in combination with other architectures or process methodologies. Moreover, those skilled in the art will appreciate that the inventive processes may be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on standalone electronic devices, such as a Flash memory module. In a distributed computing environment, program modules may be located in both local and remote memory storage modules or devices.

With reference to FIG. 13, a suitable environment 1300 for implementing various aspects of the claimed subject matter can include a host computer 1312. The host computer 1312 includes a processing unit 1314, a system memory 1316, and a system bus 1318. The system bus 1318 couples system components including, but not limited to, the system memory 1316 to the processing unit 1314. The processing unit 1314 can be any of various available processors. Dual microprocessors and other multiprocessor architectures also can be employed as the processing unit 1314.

The system bus 1318 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1316 includes volatile memory 1320 and nonvolatile memory 1322. The basic input/output system (BIOS), containing the basic routines to transfer information between elements within the computer 1312, such as during start-up, is stored in nonvolatile memory 1322. By way of illustration, and not limitation, nonvolatile memory 1322 can include ROM, PROM, EPROM, EEPROM, or Flash memory (e.g., AND Flash, NAND Flash, NOR Flash, CT-NOR Flash, CT-NAND Flash, and so on). Furthermore, nonvolatile memory 1322 can provide the platform for the various semiconductor architectures described herein. Volatile memory 1320 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Host computer 1312 also includes removable/non-removable, volatile/non-volatile computer storage media. FIG. 13 illustrates, for example, a disk storage 1324. Disk storage 1324 includes, but is not limited to, devices like a magnetic disk drive, floppy disk drive, tape drive, Jaz drive, Zip drive, LS-100 drive, flash memory card, or memory stick. In addition, disk storage 1324 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). Furthermore, disk storage 1324 can provide the platform for the various semiconductor architectures described herein. To facilitate connection of the disk storage devices 1324 to the system bus 1318, a removable or non-removable interface is typically used, such as interface 1326.

It is to be appreciated that FIG. 13 describes software that acts as an intermediary between users and the basic computer resources described in the suitable operating environment 1300. Such software includes an operating system 1328. Operating system 1328, which can be stored on disk storage 1324, acts to control and allocate resources of the host computer system 1312. System applications 1330 take advantage of the management of resources by operating system 1328 through program modules 1332 and program data 1334 stored either in system memory 1316 or on disk storage 1324. It is to be appreciated that the disclosed subject matter can be implemented with various operating systems or combinations of operating systems.

A user enters commands or information into the host computer 1312 through input device(s) 1336. Input devices 1336 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1314 through the system bus 1318 via interface port(s) 1338. Interface port(s) 1338 include, for example, a serial port, a parallel port, a game port, and a universal serial bus (USB). Output device(s) 1340 use some of the same type of ports as input device(s) 1336. Thus, for example, a USB port may be used to provide input to host computer 1312 and to output information from host computer 1312 to an output device 1340. Output adapter 1342 is provided to illustrate that there are some output devices 1340 like monitors, speakers, and printers, among other output devices 1340, which require special adapters. The output adapters 1342 include, by way of illustration and not limitation, video and sound cards that provide a means of connection between the output device 1340 and the system bus 1318. It should be noted that other devices and/or systems of devices provide both input and output capabilities such as remote computer(s) 1344.

Host computer 1312 can operate in a networked environment using logical connections to one or more remote computers, such as remote computer(s) 1344. The remote computer(s) 1344 can be a personal computer, a server, a router, a network PC, a workstation, a microprocessor based appliance, a peer device or other common network node and the like, and typically includes many or all of the elements described relative to host computer 1312. For purposes of brevity, only a memory storage device 1346 is illustrated with remote computer(s) 1344. Remote computer(s) 1344 is logically connected to host computer 1312 through a network interface 1348 and then physically connected via communication connection 1350. Network interface 1348 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1350 refers to the hardware/software employed to connect the network interface 1348 to the bus 1318. While communication connection 1350 is shown for illustrative clarity inside host computer 1312, it can also be external to host computer 1312. The hardware/software necessary for connection to the network interface 1348 includes, for exemplary purposes only, internal and external technologies such as, modems including regular telephone grade modems, cable modems and DSL modems, ISDN adapters, and Ethernet cards.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes. In addition, while a particular feature may have been disclosed with respect to only one of several implementations, such feature may be combined with one or more other features of the other implementations as may be desired and advantageous for any given or particular application.

What is claimed is:

1. Electronic memory, comprising:
    a plurality of memory transistors electrically coupled in a serial array, with one end of the array coupled to a metal bitline of the electronic memory;
    a pass transistor having a gate that is coupled to the serial array and having a drain or source coupled to an electrical contact off of a second metal bitline of the electronic memory; and
    a sensing circuit that measures current through the second metal bitline or voltage of the second metal bitline to determine a state of one of the plurality of memory transistors.

2. The electronic memory of claim 1, the sensing circuit measures the current through the second metal bitline or the voltage of the second metal bitline as modulated by a potential at the gate of the pass transistor.

3. The electronic memory of claim 1, the pass transistor has small resistance relative to the plurality of memory transistors.

4. The electronic memory of claim 1, the pass transistor has small capacitance relative to the metal bitline and second metal bitline.

5. The electronic memory of claim 1, further comprising:
    a second plurality of memory transistors electrically coupled in a second serial array, with one end of the second array coupled to the second metal bitline; and
    a second pass transistor having a gate that is coupled to the second array and having a drain and source that couple an electrical contact off of the metal bitline of the electronic memory to ground.

6. The electronic memory of claim 5, further comprising a second sensing circuit that measures current through the metal bitline or voltage of the metal bitline in order to determine a state of one of the second plurality of memory transistors.

7. The electronic memory of claim 1, further comprising a processing circuit that induces or applies a pre-charge voltage to the serial array to charge the gate of the pass transistor for determining the state.

8. The electronic memory of claim 1, further comprising a select transistor between the pass transistor and the serial array operable to isolate the gate of the pass transistor.

9. The electronic memory of claim 8, further comprising a processing circuit that applies a shut-off voltage to the select transistor to isolate the gate of the pass transistor.

10. The electronic memory of claim 1, further comprising an electrical contact at least in part composed of tungsten that couples the pass transistor with the second metal bitline.

11. The electronic memory of claim 1, further comprising a processing circuit that applies a low voltage to the bitline and a higher voltage to the second metal bitline to independently program the one of the plurality of memory transistors.

12. The electronic memory of claim 1, further comprising:
    a processing circuit that applies a low bitline voltage for programming memory cells and a high bitline voltage to inhibit programming of memory cells; and
    a plurality of serial arrays of memory transistors coupled at first respective ends thereof to respective metal bitlines of the electronic memory, wherein the processing circuit iteratively applies the low bitline voltage to respective subsets of the serial arrays to iteratively program selected memory cells of the respective subsets, and iteratively applies the high bitline voltage to inhibit programming of remaining serial arrays that are not part of the respective subsets.

13. The electronic memory of claim 1, further comprising a processing circuit that applies a read voltage to the serial array to facilitate the sensing circuit determining the state of the one of the plurality of memory transistors.

14. The electronic memory of claim 13, further comprising pre-charging the serial array and the gate of the pass transistor prior to application of the read voltage.

15. The electronic memory of claim 1, the pass transistor enables or disables a current flow at the second bitline, wherein the current flow or lack thereof is determinative of the state of the cell.

16. The electronic memory of claim 1, further comprising a select transistor that electrically connects or isolates the serial array with the gate of the pass transistor.

17. The electronic memory of claim 1, comprising trench isolation lines formed into a first layer of a semiconductor substrate to electrically isolate the serial array of memory transistors from a second serial array of memory transistors.

18. The electronic memory of claim 17, the second serial array having one end thereof connected to the second metal bitline, wherein programming or erasing the second serial array can be accomplished via a voltage applied at the second metal bitline.

19. The electronic memory of claim 18, wherein programming or erasing the serial array can be accomplished via a second voltage applied at the metal bitline.

20. The electronic memory of claim 19, further comprising a local interconnect at least in part comprised of tungsten for coupling the pass transistor to the serial array and a second local interconnect at least in part comprises of tungsten for coupling a second pass transistor to the second serial array.

* * * * *